(12) United States Patent
Chen et al.

(10) Patent No.: US 9,888,334 B1
(45) Date of Patent: Feb. 6, 2018

(54) AUDIO PLAYING SYSTEM

(71) Applicant: GEMTEK TECHNOLOGY CO., LTD, Hsinchu (TW)

(72) Inventors: Hung-Wen Chen, Hsinchu (TW); Chih-Hsu Yen, Hsinchu (TW); Fu-Ming Tien, Hsinchu (TW)

(73) Assignee: GEMTEK TECHNOLOGY CO.,LTD., Hsinchu (TW)

( * ) Notice: Subject to any disclaimer, the term of this patent is extended or adjusted under 35 U.S.C. 154(b) by 0 days.

(21) Appl. No.: 15/717,909

(22) Filed: Sep. 27, 2017

(30) Foreign Application Priority Data

Jul. 14, 2017 (TW) .............................. 106210425 U

(51) Int. Cl.
| | |
|---|---|
| *H04R 5/02* | (2006.01) |
| *H04R 29/00* | (2006.01) |
| *H04R 3/00* | (2006.01) |
| *H03G 5/00* | (2006.01) |
| *H04S 7/00* | (2006.01) |
| *H03G 5/16* | (2006.01) |
| *H04S 1/00* | (2006.01) |

(52) U.S. Cl.
CPC ............. *H04S 7/301* (2013.01); *H03G 5/165* (2013.01); *H04S 1/007* (2013.01); *H04S 7/307* (2013.01); *H04S 2400/13* (2013.01)

(58) Field of Classification Search
CPC . H04R 5/02; H04R 29/00; H04R 3/00; H04R 1/40; H03G 5/00; H04S 7/30
USPC .......... 381/303, 309, 58, 59, 96, 98, 300, 12
See application file for complete search history.

(56) References Cited

U.S. PATENT DOCUMENTS

| | | | | |
|---|---|---|---|---|
| 4,739,513 A | * | 4/1988 | Kunugi ................... | H03G 5/165 381/103 |
| 2010/0296668 A1 | * | 11/2010 | Lee ..................... | G10K 11/1784 381/94.7 |

* cited by examiner

*Primary Examiner* — Thjuan K Addy
(74) *Attorney, Agent, or Firm* — Maschoff Brennan

(57) ABSTRACT

An audio playing system has a first channel output device, a first equalizer, a second channel output device, a second equalizer, a loudness adjusting button, and a controller. The first equalizer adjusts a first channel audio signal with a set of first parameters of frequency response and output it to the first channel output device. The second equalizer adjusts a second channel audio signal with a set of second parameters of frequency response and output it to the second channel output device. The loudness adjusting button generates a loudness instruction. The controller determines an upper limit of loudness based on the set of first parameters of frequency response and the set of second parameters of frequency response, and adjusts a loudness related to the first channel audio signal and a loudness related to the second channel audio signal based on the upper limit of loudness and the loudness instruction.

8 Claims, 18 Drawing Sheets

AUDIO PLAYING SYSTEM

CROSS-REFERENCE TO RELATED APPLICATIONS

This non-provisional application claims priority under 35 U.S.C. § 119(a) on Patent Application No(s). 106210425 filed in Taiwan on Jul. 17, 2017, the entire contents of which are hereby incorporated by reference.

BACKGROUND

Technical Field

The present disclosure is related to an audio playing system, and more particularly to an audio playing system capable of automatically personally compensating.

Related Art

Loudspeakers and earphones are now broadly used in the applications of audio-video field. Ideally, the both channels (left channel and right channel) of the loudspeaker/earphone have the same characteristic. However, due to the limitations of manufacture or materials, the left channel of an earphone and the right channel of the earphone usually have different characteristic. For example, if a piece of audio signal is output by both channels, the left channel may provide higher loudness than the right channel in low-band while the right channel provide higher loudness than the left channel in high-band. Hence, the experience of listening music of the user is influenced.

Further, even if the both channels of an earphone/loudspeaker have identical characteristic, the characteristics of ears of a person may be different. For example, a user of an earphone has his left ear more sensitive to high-band audio signal than his right ear and has his right ear more sensitive to low-band audio signal than his left ear. In this condition, even if the both channels of the earphone have the same characteristic, the user cannot has good audio experience because of the unbalance of ears. Hence, how to provide an audio playing system to optimize the audio experience by measuring the response of the user for the earphone/loudspeaker, and obtaining the characteristic of the earphone/loudspeaker and the user's ears so as to adjust the equalizers to compensate the difference between two channels and the difference between two ears, and to conquer the weakness that the quality of sound is affected, to provide good sound effect to meet the user's expect for high quality of sound are problems to be solved.

SUMMARY

In one embodiment of the present disclosure, an audio playing system has a first channel output device, a first equalizer and a controller. The first equalizer is electrically coupled to the first channel output device and having a set of first parameters of frequency response, the first equalizer configured to adjust a received first channel audio signal with the set of first parameters of frequency response and output the adjusted first channel audio signal to the first channel output device. The controller is electrically coupled to the first channel output device and the first equalizer, wherein in a test mode, the controller is configured to send a set of test audio signals to the first channel output device, to generate a set of first user parameters based on a plurality of pieces of received first confirmation signal, and to adjust the set of first parameters of frequency response based on the set of first user parameters.

In one embodiment of the present disclosure, an audio playing system has a first channel output device, a first equalizer, a second channel output device, a second equalizer, a loudness adjusting button, and a controller. The first equalizer has a set of first parameters of frequency response and is configured to adjust a first channel audio signal with the set of first parameters of frequency response and to output the adjusted first channel audio signal to the first channel output device. The second equalizer has a set of second parameters of frequency response and is configured to adjust a second channel audio signal with the set of second parameters of frequency response and to output the adjusted second channel audio signal to the second channel output device. The loudness adjusting button is configured to generate a loudness instruction. In a test mode, the controller is configured to send a set of test audio signals to the first channel output device, to generate a set of first user parameters based on a plurality of pieces of received first confirmation signal, to adjust the set of first parameters of frequency response based on the set of first user parameters, to send the set of test audio signals to the second channel output device, to generate a set of second user parameters based on a plurality of pieces of received second confirmation signal, and to adjust the set of second parameters of frequency response based on the set of second user parameters. The controller determines an upper limit of loudness based on the set of first parameters of frequency response and the set of second parameters of frequency response, and adjusts a loudness related to the first channel audio signal and a loudness related to the second channel audio signal based on the upper limit of loudness and the loudness instruction.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
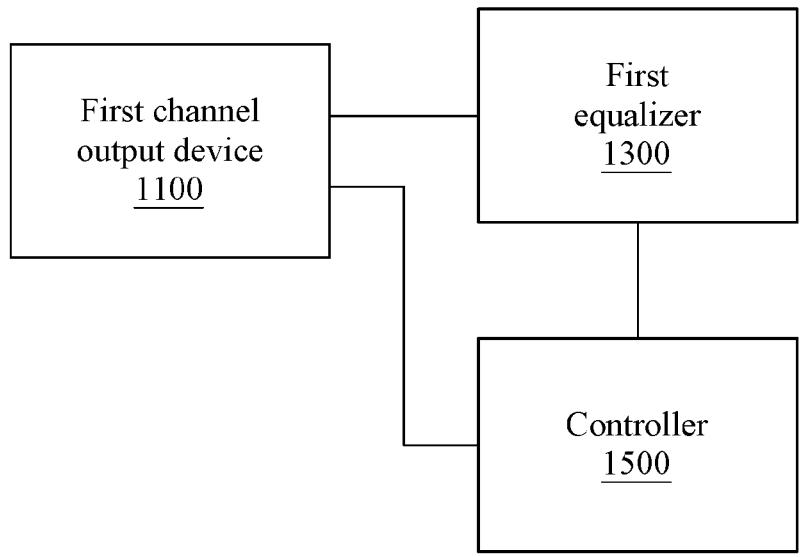
FIG. 1 is a schematic diagram of an audio playing system according to one embodiment of the present disclosure.

Please refer to FIG. 1, which is a schematic diagram of an audio playing system according to one embodiment of the present disclosure. As shown in FIG. 1, the audio playing system 1000 according to one embodiment of the present disclosure has a first channel output device 1100, a first equalizer 1300 and a controller 1500. The first equalizer 1300 is electrically coupled to the first channel output device 1100, and the controller 1500 is electrically coupled to the first channel output device 1100 and the first equalizer 1300. In this disclosure, the audio playing system is, for example, a system for outputting audio signal with earphone, loudspeaker, etc.

Figure 2:
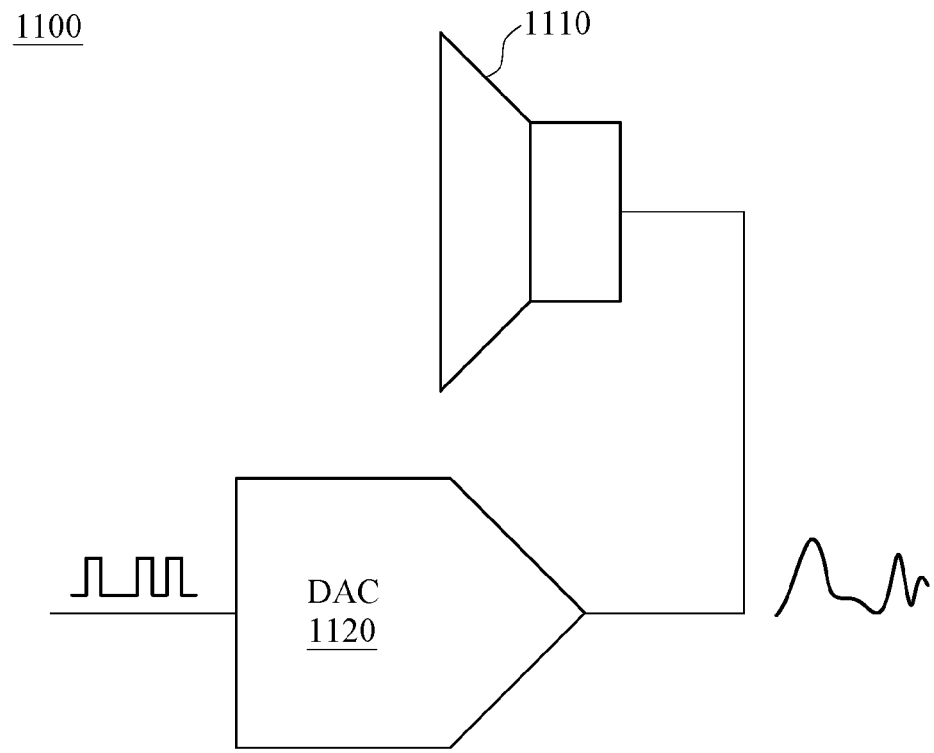
FIG. 2 is a functional block diagram of the first channel output device according to one embodiment of the disclosure.

In one embodiment, the first channel output device 1100 is a simple loudspeaker. When the coil of the loudspeaker is driven by current, the coil makes the vibrating film vibrate to generate sound. In another embodiment, the first channel output device 1100 has the loudspeaker and a digital-to-analog converter (DAC) therein. For explaining the mechanism, please refer to FIG. 2, which is a functional block diagram of the first channel output device according to one embodiment of the disclosure. As shown in FIG. 2, the first channel output device 1100 according to one embodiment of the disclosure has a loudspeaker 1110 and a DAC 1120. The DAC 1120 converts the received digital audio signal into current and the current drives the coil of the loudspeaker 1110 so as to make the vibrating film vibrate and generate sound. In other words, the first channel output device 1100 may be driven by digital audio signal or analog audio signal to generate sound.

The first equalizer 1300 has a set of first parameters of frequency response. When the first equalizer 1300 receives the first channel audio signal, the first equalizer 1300 adjusts the received first channel audio signal with the first parameters of frequency response and outputs the adjusted first channel audio signal to the first channel output device. In one embodiment, the first equalizer 1300 is integrated circuits (IC) with digital signal processing (DSP) ability which can implement the filter with certain frequency response by DSP. Further, what is outputted by the first equalizer 1300 is a segment of the digital signal corresponding to the adjusted first channel audio signal. In this embodiment, the first equalizer 1300 can be used together with the first channel output device 1100 having embedded digital-to-analog converter and loudspeaker therein.

In another embodiment, the first equalizer 1300 has a digital-to-analog converter therein in addition, so what is outputted by the first equalizer 1300 is a segment of analog signal corresponding to the adjusted first channel audio signal. The first equalizer 1300 in this embodiment can be used together with the first channel output device 1100 without the digital-to-analog converter. In another embodiment, the first equalizer 1300 is, for example, an equalizer implemented by software.

For understanding the utilities of the set of first parameters of frequency response, please refer to table I shown below, which illustrate the set of first parameters of frequency response.

TABLE I

| Frequency (Hz) | 110 | 220 | 440 | 880 | 1760 | 3520 | 7040 | 14080 |
|---|---|---|---|---|---|---|---|---|
| Gain (dB) | +6 | +6 | 0 | −3 | −3 | −3 | +3 | +3 |

As shown in table I, the set of first parameters of frequency response of the first equalizer 1300 has eight pieces of data, and each piece of data is consisting of a frequency and a gain. That is, the set of first parameters of frequency response defines the frequency response of the first equalizer 1300 by indicating the gains of certain frequencies. In one embodiment, only the gains are adjustable when adjusting the set of first parameters of frequency response. In another embodiment, either the frequencies or the gains are adjustable. For example, the table I may be adjusted as the table II as shown below:

TABLE II

| Frequency (Hz) | 1000 | 2000 | 3000 | 4000 | 6000 | 8000 | 10000 | 20000 |
|---|---|---|---|---|---|---|---|---|
| Gain (dB) | +12 | +6 | +3 | +0 | +0 | +0 | +0 | +6 |

In one embodiment, the gain at the frequencies lower than the smallest frequency defined in the set of first parameters of frequency response is equal to the gain at the smallest frequency defined in the set of first parameters of frequency response. The gain at the frequencies higher than the highest frequency defined in the set of first parameters of frequency response is equal to the gain at the highest frequency defined in the set of first parameters of frequency response. Specifically, taking table II for example, the first equalizer 1300 set according to the table II has a gain of +12 decibel (dB) at any frequency lower than 1 kHz and a gain of +6 dB at any frequency higher than 20 kHz. Although the first parameters of frequency response in either the table I or the table II is consisting of eight pieces of data, the number of pieces of data in the first parameters of frequency response is not limited by the disclosure. Further, even there are eight pieces of data predefined in the set of first parameters of frequency response, the controller 1500 is capable of adding or eliminating one or more pieces of data in the set of first parameters of frequency response arbitrarily when the controller 1500 is adjusting the set of first parameters of frequency response. For example, the controller 1500 is capable of defining the set of first parameters of frequency response with only five pieces of data. The controller 1500 is also capable of defining the set of first parameters of frequency response with ten pieces of data.

Figure 3:
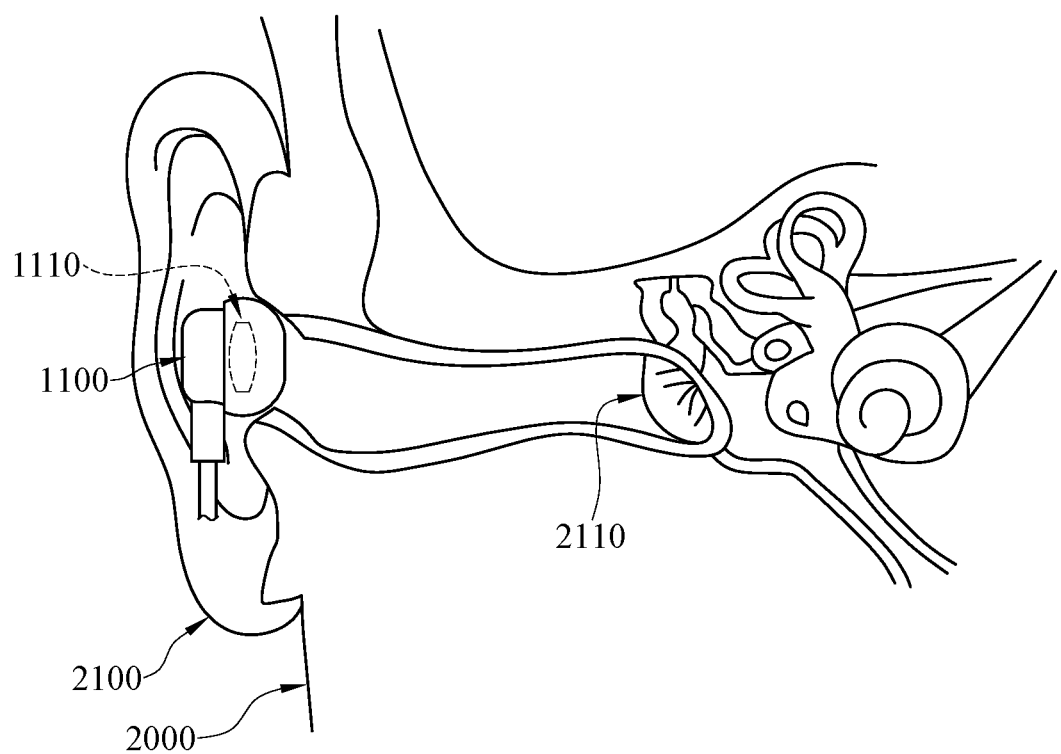
FIG. 3 illustrates an operation diagram of the audio playing system according to one embodiment of the disclosure.

One utility of the controller 1500 is for adjusting the set of first parameters of frequency response of the first equalizer 1300. The controller 1500 is implemented by either an IC or software. In one embodiment, please refer to FIG. 3, which illustrates an operation diagram of the audio playing system according to one embodiment of the disclosure. As shown in FIG. 3, the first channel output device 1100 of the audio playing system 1000 is put in the right ear 2100 of the user 2000, and the right ear 2100 of the user 2000 has an eardrum 2110. The coil and the vibrating film of the loudspeaker 1110 of the first channel output device 1100 has a first sound pressure level response (SPL response) SPL1. What is the sound pressure level response is the distribution of the ratio between the actual loudness and the amplitude of the audio signal at each frequency when the first channel output device 1100 is driven by the audio signal to generate sound. Similarly, the eardrum 2110 of the user 2000 has a second sound pressure level response (SPL response) SPL2 which reflects a frequency response of the sensitivity of hearing of the user 2000.

When the user 2000 is equipped with the audio playing system 1000 according to one embodiment of the disclosure, he may choose to use the audio playing system 1000 in the test mode. In the test mode, the controller 1500 sends a set of test audio signals to the first channel output device 1100. In one embodiment, the test audio signals have, for example, 20 sets of narrow bandwidth audio signals. In one embodiment, the central frequency of the first set of narrow bandwidth audio signals is 500 Hz; the central frequency of the second set of narrow bandwidth audio signals is 1000 Hz; the central frequency of the third set of narrow bandwidth audio signals is 1500 Hz; and the central frequency of the twentieth set of narrow bandwidth audio signals is 10 kHz. In other words, the difference between the central frequencies of the sets of narrow bandwidth audio signals is no less than 500 Hz. Besides, the bandwidth of each set of narrow bandwidth audio signals is, for example, 100 Hz. In one embodiment, each set of narrow bandwidth audio signals has three pieces of narrow bandwidth test audio signal, and the strength of the pieces of narrow bandwidth test audio signal are different from one another. In other words, the loudness of each piece of narrow bandwidth test audio signal when output is different from that of another.

In one embodiment, when the controller 1500 sends the test audio signals to the first channel output device 1100, the controller 1500 sequentially sends the aforementioned twenty sets of narrow bandwidth audio signals, from the first set to the twentieth set, to the first channel output device 1100. In other words, the test is performed from low frequency to high frequency. In another embodiment, when the controller 1500 sends the test audio signals to the first channel output device 1100, the twenty sets of narrow bandwidth audio signals are not sent in sequence from low frequency to high frequency. On the contrary, the controller 1500 at first outputs one set of narrow bandwidth audio signals in the mid-band among the twenty sets of narrow bandwidth audio signals. Said set of narrow bandwidth audio signals in mid-band is, for example, a set of narrow bandwidth audio signal whose central frequency falls between 3 kHz and 7.5 kHz. That is, a set of narrow bandwidth audio signals among the sixth set to the fifteenth set of narrow bandwidth audio signals. Specifically, the controller 1500 is capable of classifying the twenty sets of narrow bandwidth audio signals into three categories. The first category contains sets of narrow bandwidth audio signals in low-band such as sets of narrow bandwidth audio signal whose central frequency is no more than 2.5 kHz. The second category contains sets of narrow bandwidth audio signals in mid-band. The third category contains sets of narrow bandwidth audio signals in high-band such as sets of narrow bandwidth audio signals whose central frequency is no less than 8 kHz. The controller 1500 at first selects one set of narrow bandwidth audio signals from the second category, such as the tenth set of narrow bandwidth audio signals, whose central frequency is 5 kHz, to be sent to the first channel output device 1100. Then, the controller 1500 selects one set of narrow bandwidth audio signals from the first category, such as the first set of narrow bandwidth audio signals, whose central frequency is 500 Hz, to be sent to the first channel output device 1100. In the subsequent procedure in the test mode, the controller 1500 does neither successively output two sets of narrow bandwidth audio signals in the first category nor successively output two sets of narrow bandwidth audio signals in the third category.

In another embodiment, the controller 1500 operates as a finite state machine or other mechanism in the test mode so as to output one or more sets of narrow bandwidth audio signals in the second category during the first period, and then output one or more sets of narrow bandwidth audio signals in the first category during the second period, and then output one or more sets of narrow bandwidth audio signals in the third category during the third period, and repeatedly to perform the test.

Because the hearing of human is more sensitive to the audio signal in the mid-band than in low-band or in high-band, the aforementioned procedure insure that the user would not consider the audio playing system as malfunction just because he misses the test audio signal for a long time.

In the aforementioned embodiment, although the difference between the central frequencies of adjacent two sets of narrow bandwidth audio signals is 500 Hz, that difference may be adjusted as needed and is not necessarily a constant value. For example, in one implementation, the central frequency of the first set of narrow bandwidth audio signals is 100 Hz; the central frequency of the second set of narrow bandwidth audio signals is 200 Hz; the central frequency of the third set of narrow bandwidth audio signals is 400 Hz; the central frequency of the fourth set of narrow bandwidth audio signals is 800 Hz; the central frequency of the fifth set of narrow bandwidth audio signals is 1.6 kHz; the central frequency of the sixth set of narrow bandwidth audio signals is 3.2 kHz; the central frequency of the seventh set of narrow bandwidth audio signals is 6.4 kHz; and the central frequency of the eighth set of narrow bandwidth audio signals is 12.8 kHz. In one embodiment, the central frequency of every set of narrow bandwidth audio signals is between 20 Hz and 20 kHz. However, in other embodiments, the central frequency of each set of narrow bandwidth audio signals may be between 100 Hz and 10 kHz or between 1 kHz and 10 kHz.

In one embodiment, when the controller 1500 outputs a set of narrow bandwidth audio signals, the controller 1500 first outputs the piece of narrow bandwidth test audio signal with least loudness and then outputs the others in sequence of increasing the loudness. Whenever the user 2000 hears the sound output by the audio playing system 1000, the user 2000 input a gesture on an input device signaling with the controller 1500, so the controller 1500 receives a corresponding first confirmation signal. For example, the input device is a remote controller or a touch screen. As illustrated above, the controller 1500 performs the test with the 20 sets of narrow bandwidth audio signals, and generates a set of first user parameters SPLU1 based on a plurality of received first confirmation signals. The controller 1500 adjusts the set of first parameters of frequency response based on the set of first user parameters SPLU1. In the aforementioned examples, though the test audio signals used by the controller 1500 have 20 sets of narrow bandwidth audio signals and each set of narrow bandwidth audio signals has three pieces of narrow bandwidth test audio signal with different loudness, the present disclosure is not to limit the amount. One having ordinary skill in the art may set the test audio signals based on his need.

Figure 4A:
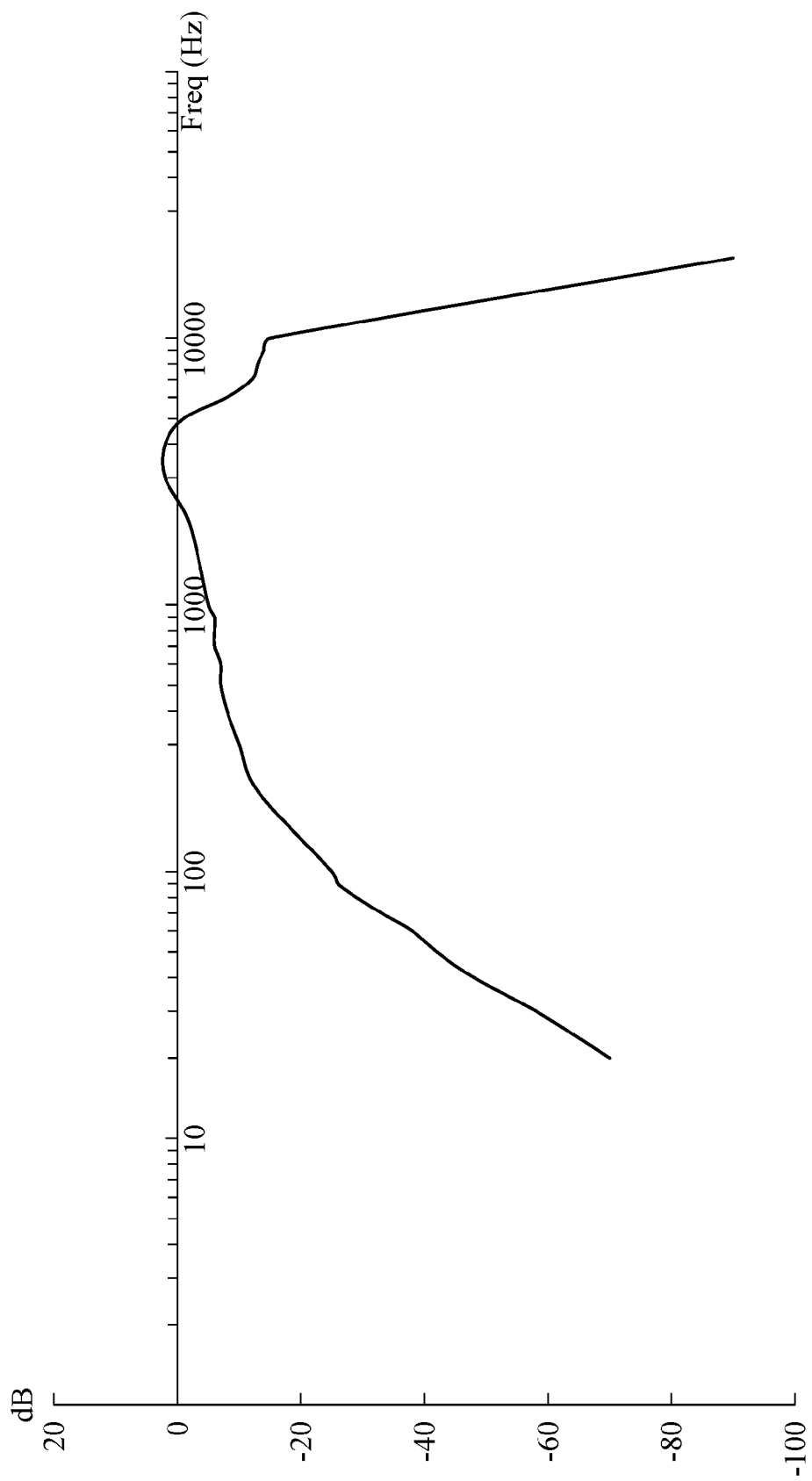
FIG. 4A illustrates the spectrum of sensitivity of hearing of ideal ear of human.
Figure 4B:
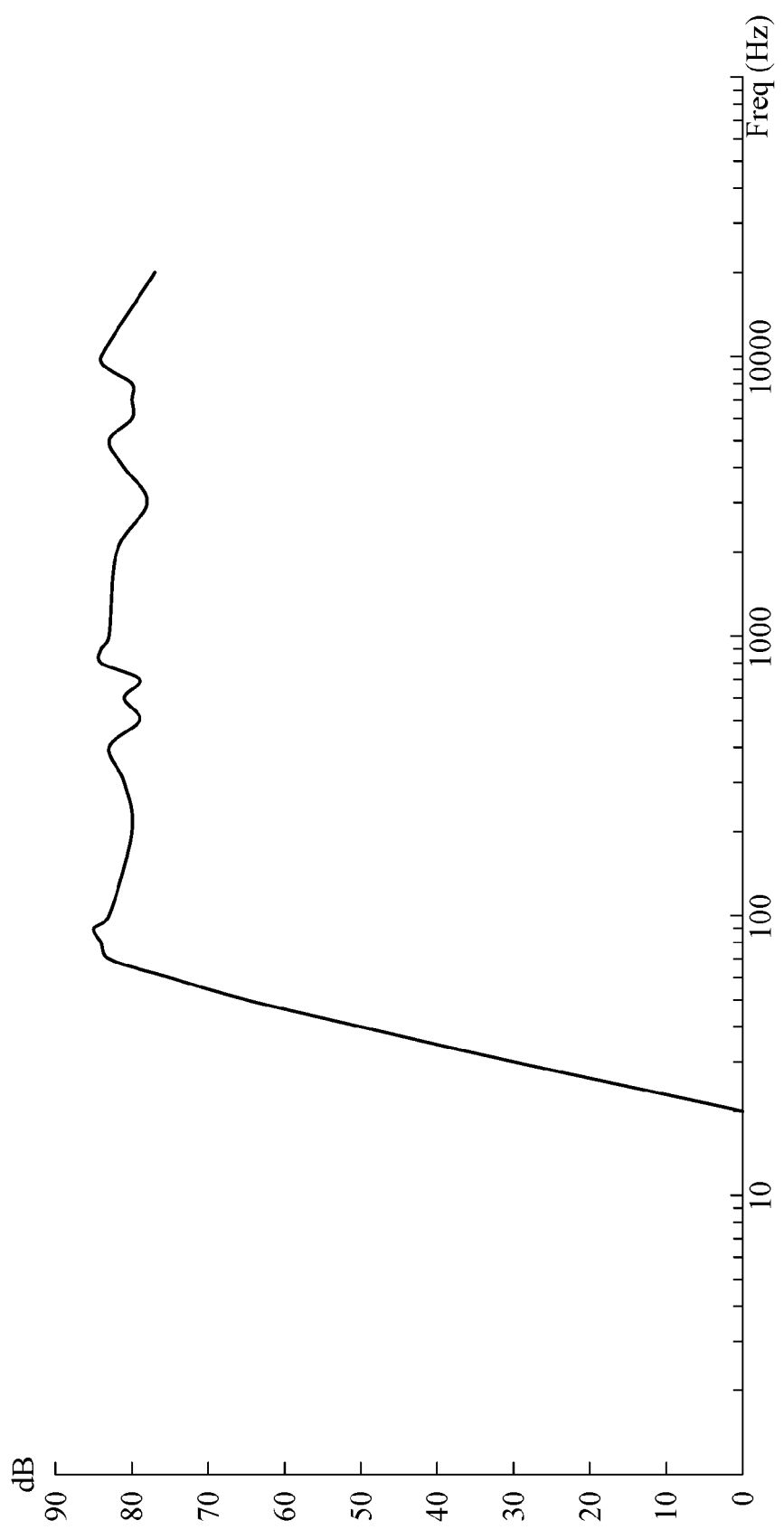
FIG. 4B illustrates a spectrum of sound pressure level response of a channel output device.
Figure 4C:
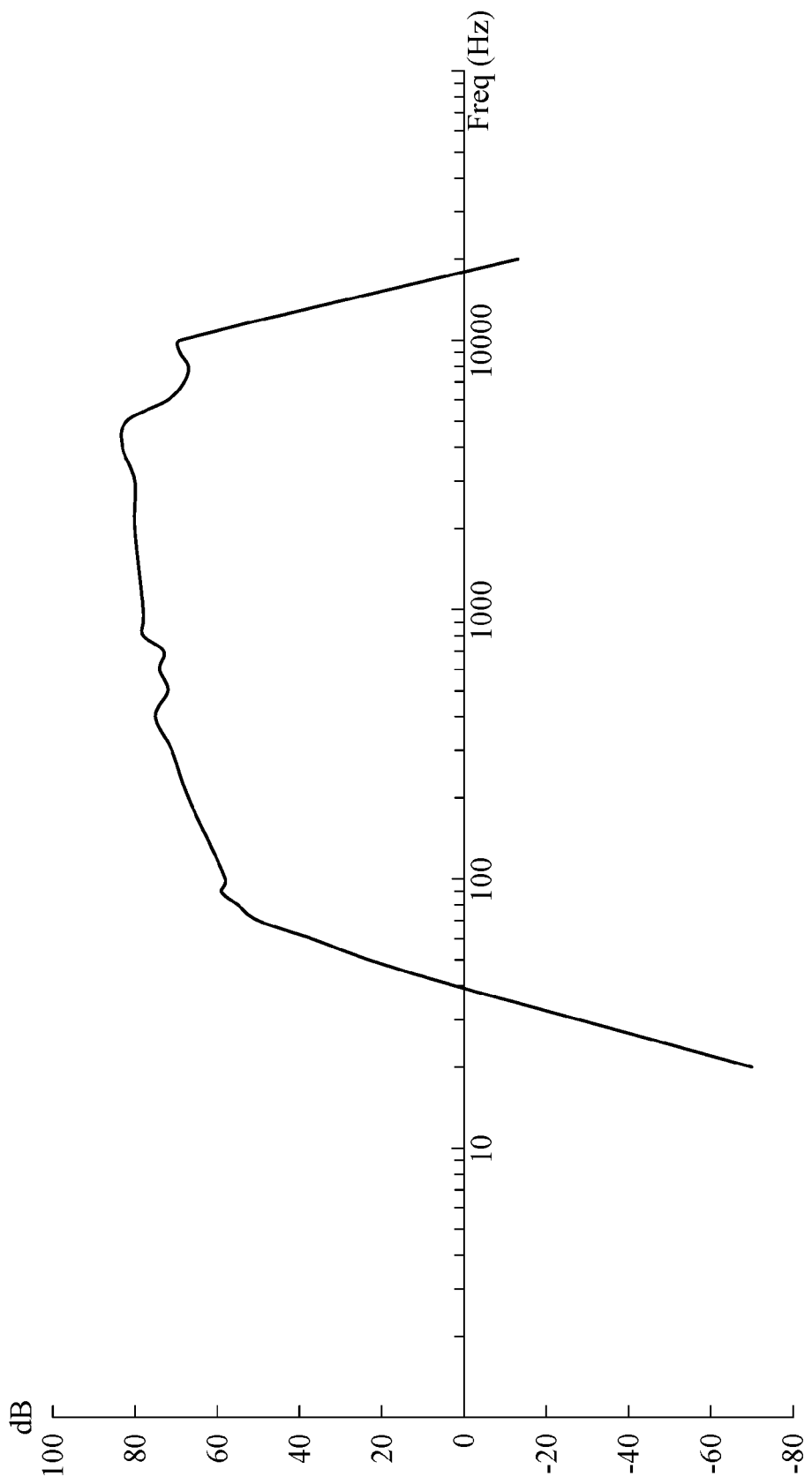
FIG. 4C is a superposition of both of FIG. 4A and FIG. 4B.

For understanding the meaning of the set of first user parameters SPLU1 and the mechanism of adjusting the set of first parameters of frequency response based on the first user parameters SPLU1, please refer to FIG. 4A~FIG. 4C. FIG. 4A illustrates the spectrum of sensitivity of hearing of ideal ear of human, and that is an ideal spectrum of the aforementioned second sound pressure level response SPL2. FIG. 4B illustrates a spectrum of sound pressure level response of a channel output device. For example, FIG. 4B may be obtained by scanning with signal having maximum amplitude. Specifically, if the DAC of one channel output device is capable of driving the loudspeaker with 1 $V_{p-p}$ signal, FIG. 4B is obtained by driving the loudspeaker with 1 $V_{p-p}$ signal at a variety of frequencies and analyzing the loudness of sound output by the loudspeaker. In other words, FIG. 4B may be seen as the spectrum of the aforementioned first sound pressure level response SPL1. FIG. 4C is a superposition of both of FIG. 4A and FIG. 4B, and it illustrates the spectrum of the set of ideal first user parameters SPLU1.

Figure 5A:
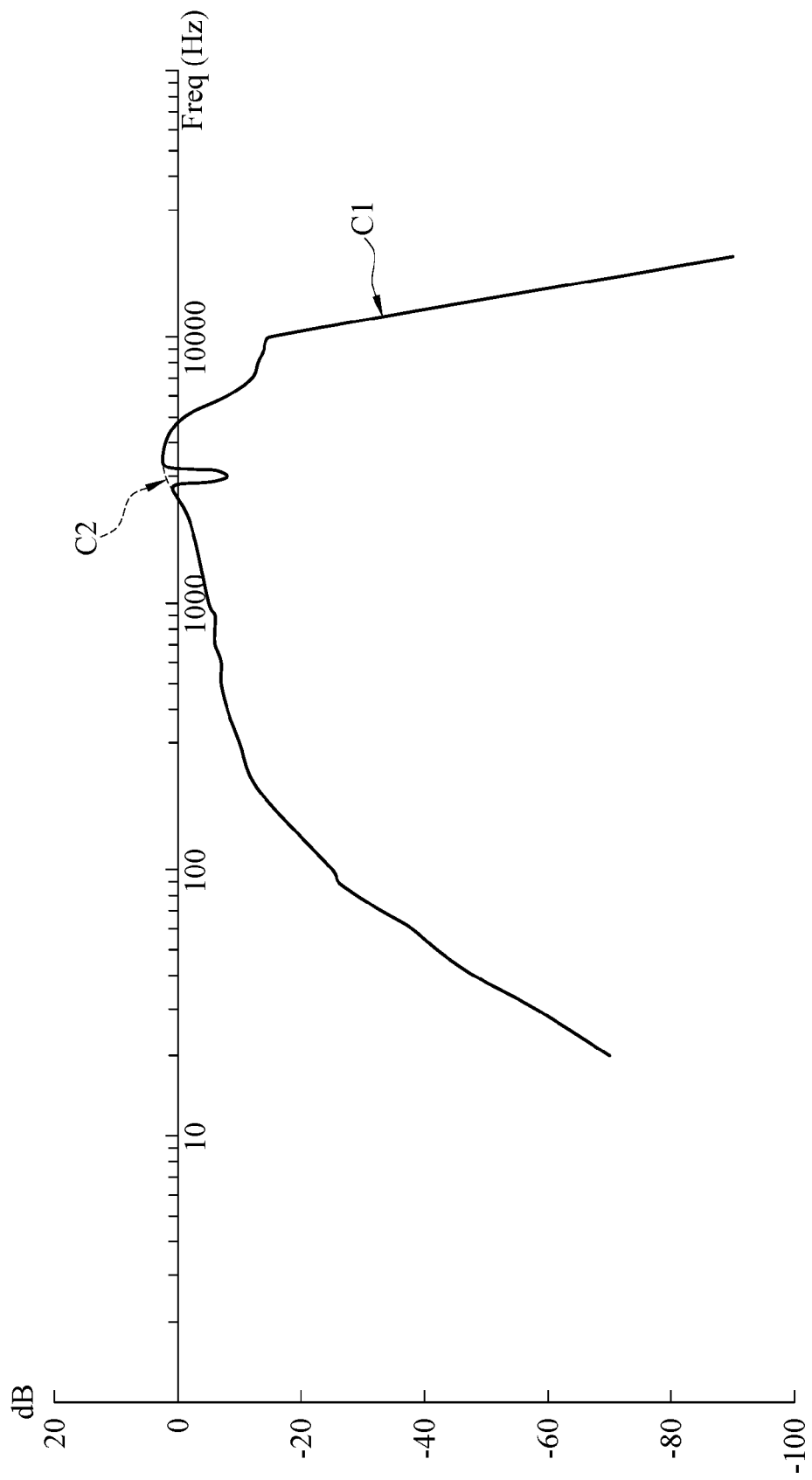
FIG. 5A is a comparison between the real hearing sensitivity of user and the ideal hearing sensitivity.
Figure 5B:
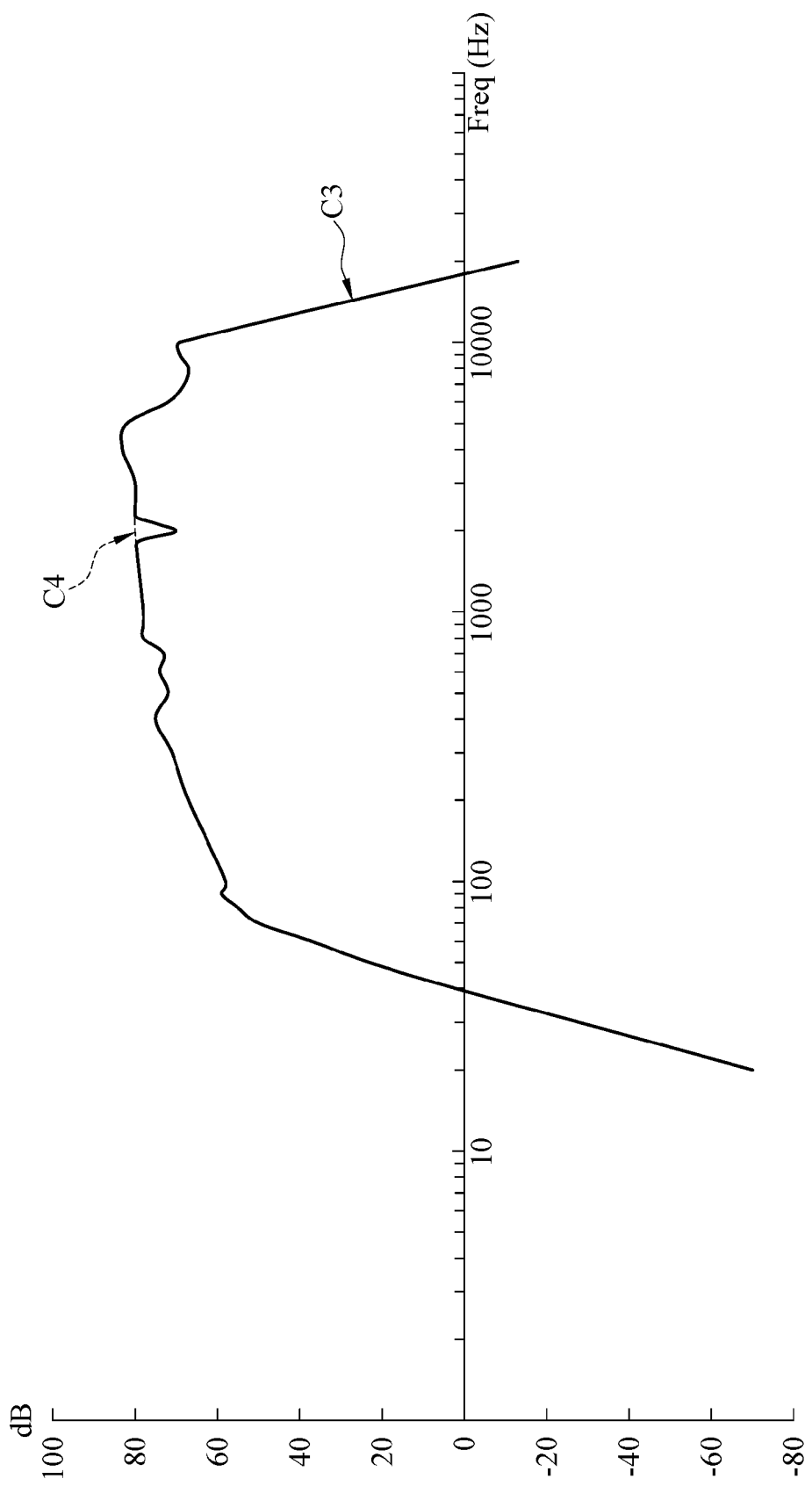
FIG. 5B is a comparison between the set of real first user parameters and the set of ideal first user parameters based on FIG. 5A.

Please refer to FIG. 5A and FIG. 5B, wherein FIG. 5A is a comparison between the real hearing sensitivity of user and the ideal hearing sensitivity, and FIG. 5B is a comparison between the set of real first user parameters and the set of ideal first user parameters based on FIG. 5A. As shown in FIG. 5A, the curve C1 is the spectrum of the hearing sensitivity of the right ear 2100 of the user 2000 while the curve C2 is the spectrum of the ideal hearing sensitivity. As shown in FIG. 5B, the curve C3 is related to the set of first user parameters corresponding to the curve C1 in FIG. 5A while the curve C4 is related to the set of ideal first user parameters.

In this embodiment, it is assumed that the first channel output device is ideal. As shown in FIG. 5A, the right ear 2100 of the user 2000 is less sensitive to sound with frequency around 2 kHz compared with the ideal hearing sensitivity. Hence, as shown in FIG. 5B, the sensitivity of the curve C3 is lower than the sensitivity of the curve C4 around 2 kHz. The set of first user parameters SPLU1 measured by the controller 1500 in the test mode is, for example, shown in table III.

TABLE III

| Frequency (Hz) | ... | 500 | 1000 | 1500 | 2000 | 2500 | 3000 | ... |
|---|---|---|---|---|---|---|---|---|
| Δ SPL(dB) | ... | 0 | 0 | 0 | −10 | 0 | 0 | ... |

Here, ΔSPL represents the difference between ideal condition and the real condition when the first channel audio signal is output by the first channel output device 1100, passing through the cavity formed by the auditory meatus and the first channel output device 1100 as it is worn by the user 2000, and received by the ear 2100 of the user 2000. Hence, the controller 1500 adjusts the set of first parameters of frequency response as shown in Table IV.

TABLE IV

| Frequency (Hz) | 1500 | 2000 | 2500 |
|---|---|---|---|
| Gain | 0 | 10 | 0 |

Figure 6A:
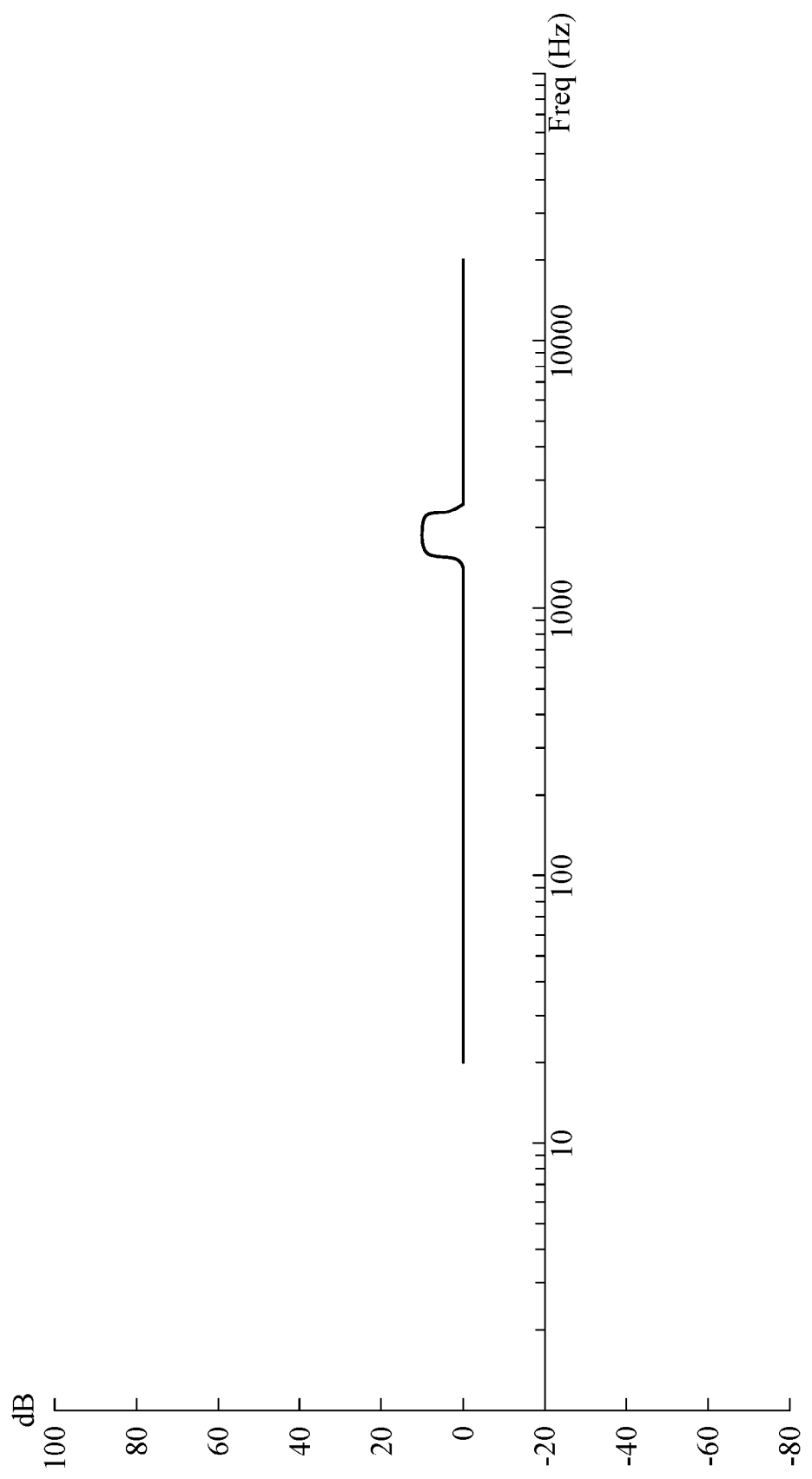
FIG. 6A illustrates a spectrum of the first frequency response of the first equalizer.
Figure 6B:
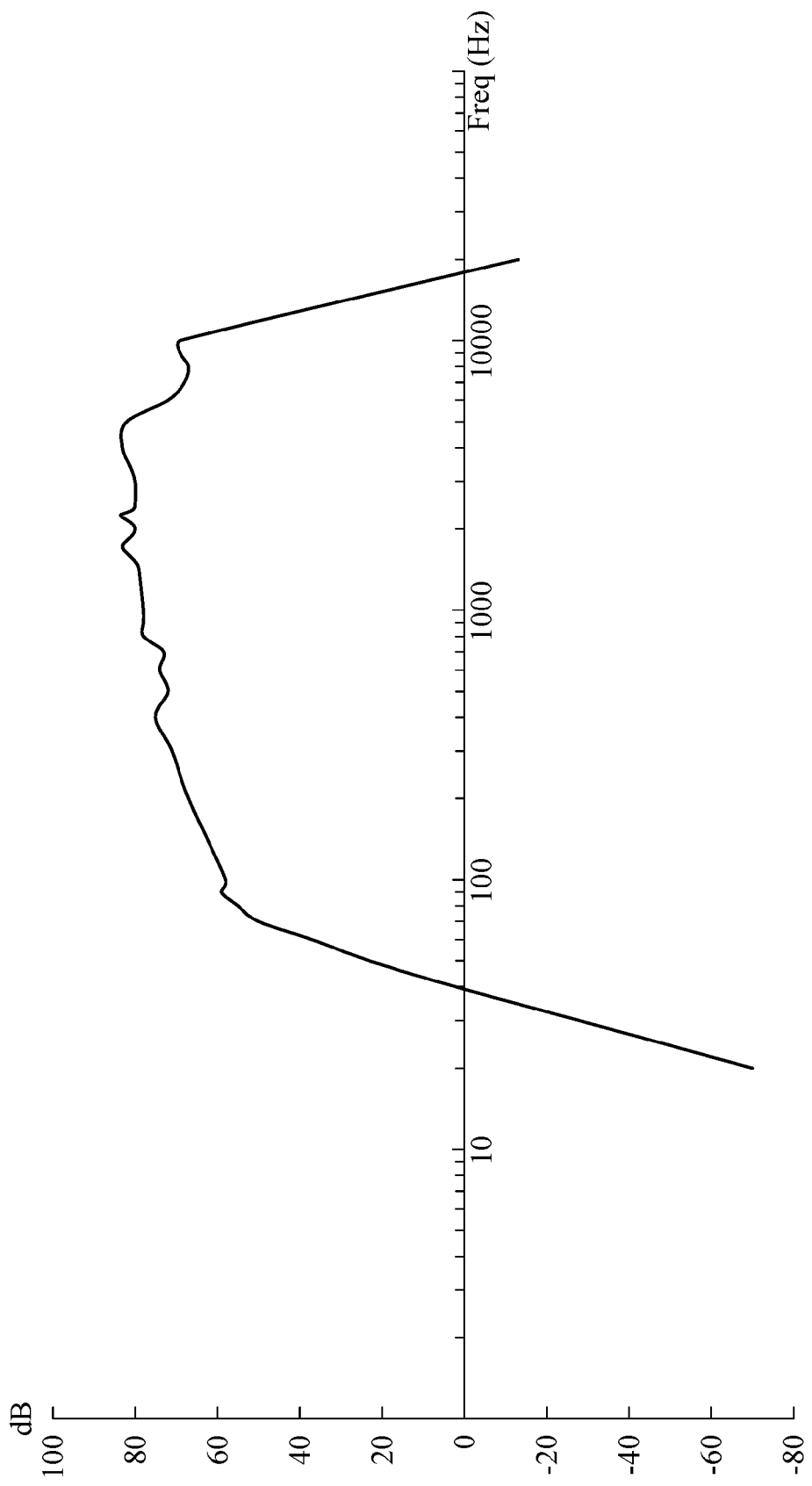
FIG. 6B illustrates a spectrum of the sound pressure level compensated by the equalizer.

Hence, the spectrum of the first frequency response of the first equalizer 1300 is shown in FIG. 6A and the spectrum of sound pressure level heard by the user is shown in FIG. 6B. It can be seen that the sound adjusted by the first equalizer 1300 and heard by the user 2000 is approximately equal to the sound heard by the user ideally, as shown in FIG. 4C.

Figure 7A:
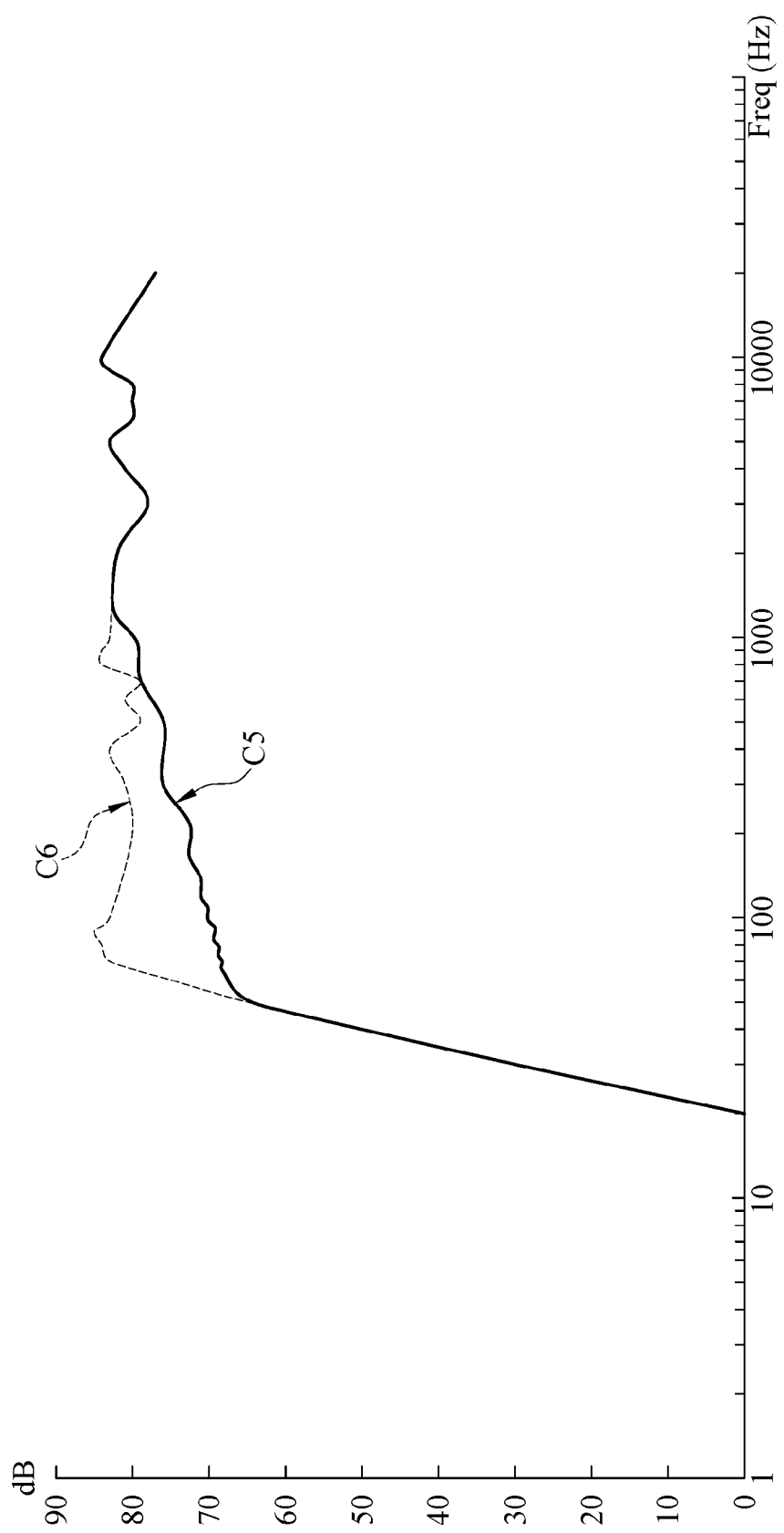
FIG. 7A illustrates a comparison between the real first sound pressure level response of the first channel output device and the theoretical sound pressure level response of the first channel output device.
Figure 7B:
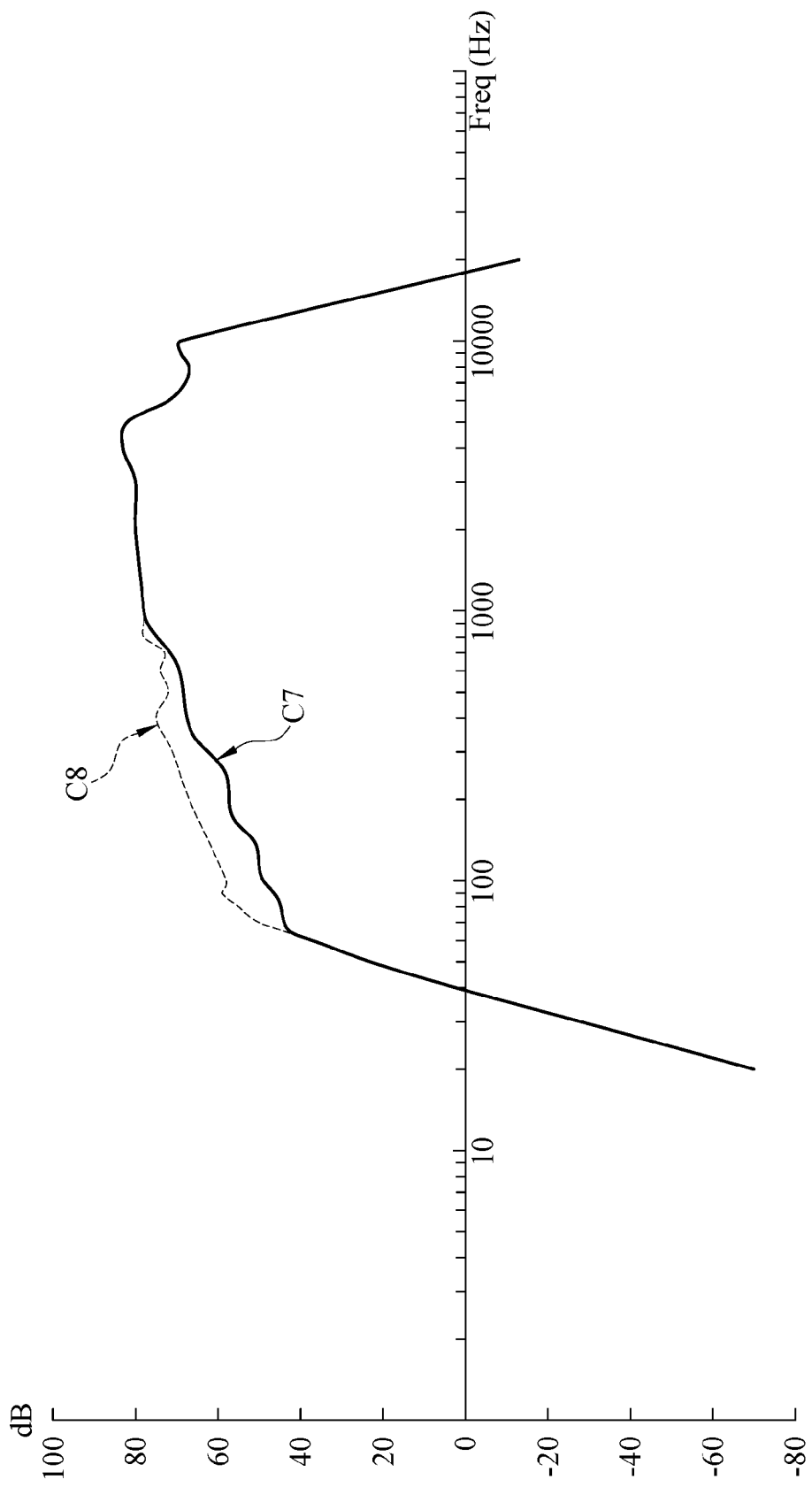
FIG. 7B illustrates a comparison between the set of real first user parameters and the set of ideal first user parameters corresponding to FIG. 7A.

Please refer to FIG. 7A and FIG. 7B, wherein FIG. 7A illustrates a comparison between the real first sound pressure level response of the first channel output device and the theoretical sound pressure level response of the first channel output device, and FIG. 7B illustrates a comparison between the set of real first user parameters and the set of ideal first user parameters corresponding to FIG. 7A. As shown in FIG. 7A, the curve C5 is the real first sound pressure level response of the first channel output device 1100 while the curve C6 is the first sound pressure level response of the first channel output device 1100 provided by the manufacturer. As shown in FIG. 7B, the curve C7 is related to the set of real first user parameters corresponding to the curve C5 while the curve C8 is related to the set of ideal first user parameters.

In this embodiment, assuming that the hearing sensitivity of the right ear 2100 of the user 2000 is ideal. As shown in FIG. 7A, the first channel output device 1100 has less loudness than its ideal characteristic for sound with frequency less than 1 kHz. Hence, as shown in FIG. 7B, the curve C7 is lower than the curve C8 for frequency less than 1 kHz. The set of first user parameters SPLU1 measured by the controller 1500 in the test mode is as shown in table V.

TABLE V

| Frequency (Hz) | 500 | 1000 | 1500 | 2000 | 2500 | 3000 | 3500 | ... |
|---|---|---|---|---|---|---|---|---|
| Δ SPL(dB) | −5 | −1 | 0 | 0 | 0 | 0 | 0 | ... |

Here, ΔSPL represents the difference between ideal condition and the real condition when the first channel audio signal is output by the first channel output device 1100, passing through the cavity formed by the auditory meatus and the first channel output device 1100 as it is worn by the user 2000, and received by the ear 2100 of the user 2000. Hence, the controller 1500 adjusts the set of first parameters of frequency response as shown in Table VI.

TABLE VI

| Frequency (Hz) | 500 | 1000 | 1500 |
|---|---|---|---|
| Gain | +5 | +1 | 0 |

Figure 8A:
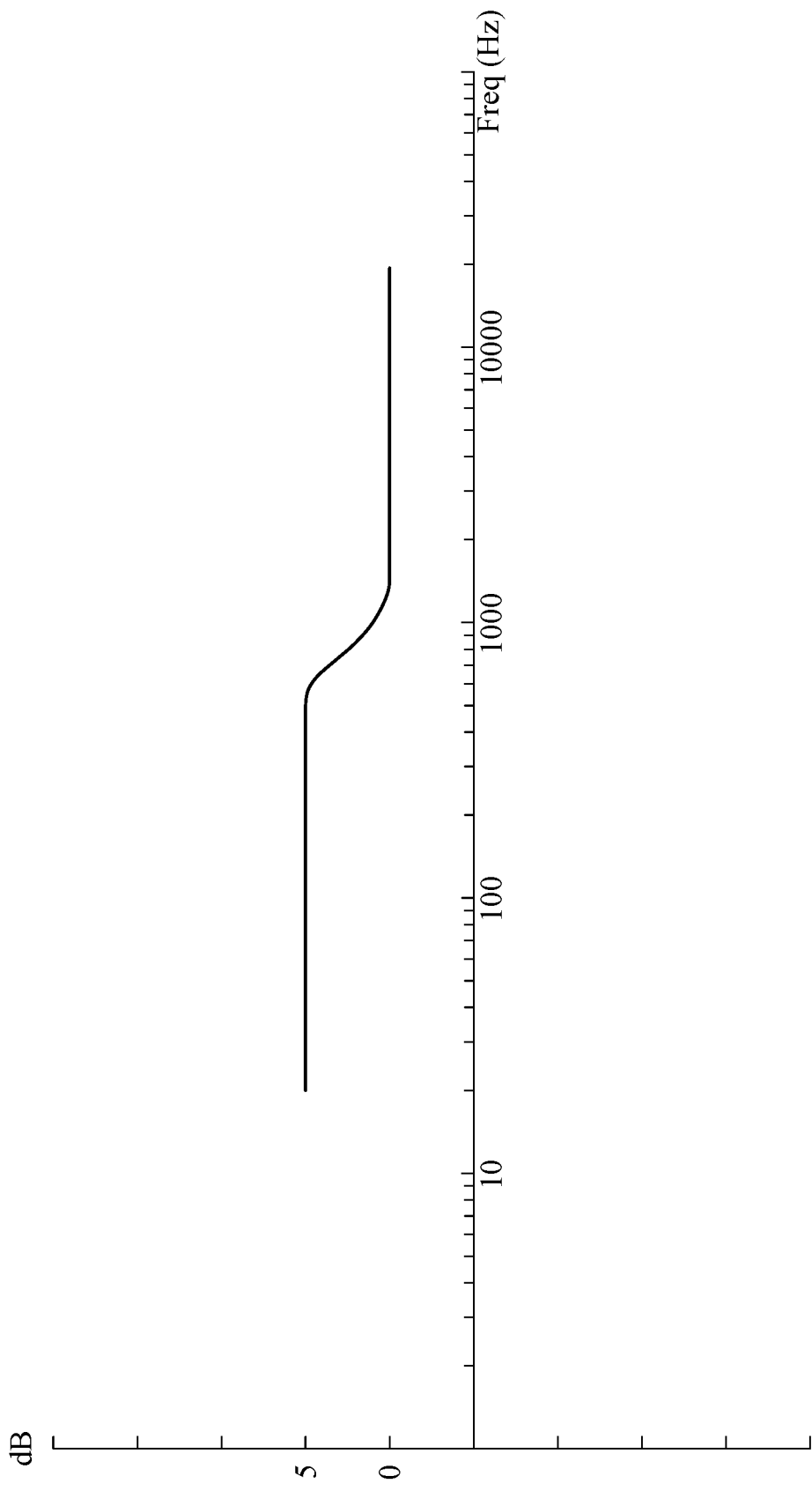
FIG. 8A illustrates a spectrum of the first frequency response of the first equalizer.
Figure 8B:
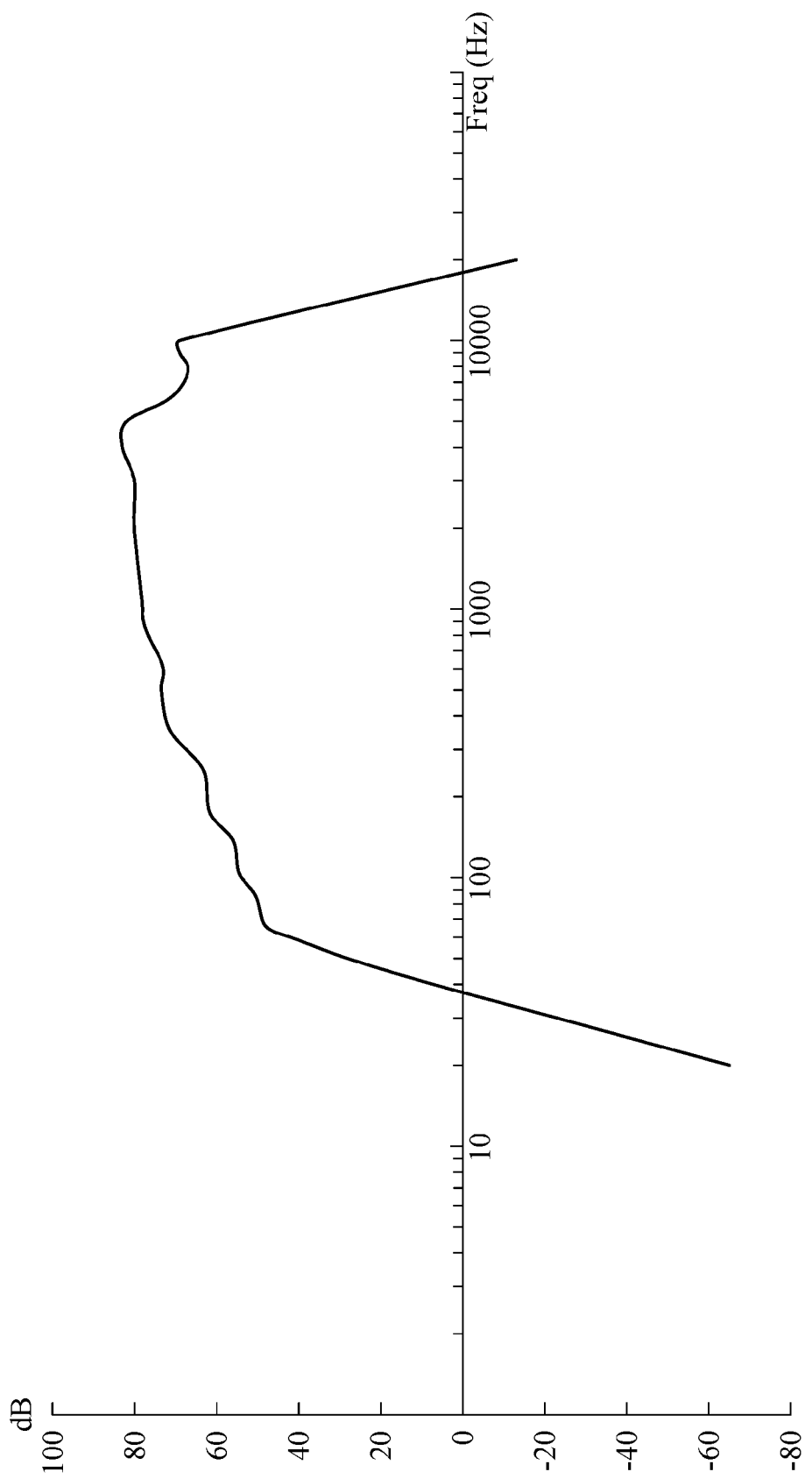
FIG. 8B illustrates a spectrum of the sound pressure level compensated by the equalizer.

Hence, the spectrum of the first frequency response of the first equalizer 1300 is shown in FIG. 8A and the spectrum of sound pressure level heard by the user is shown in FIG. 8B. It can be seen that the sound adjusted by the first equalizer 1300 and heard by the user 2000 is approximately equal to the sound heard by the user ideally, as shown in FIG. 4C.

In the aforementioned embodiments, the compensation is achieved by adjusting the loudness at certain frequencies at which the ear or the first channel output device of the audio playing system is less sensitive. However, in another embodiment, the loudness at the frequencies adjacent to the flaw frequency is increased so as to let the user experience the normal hearing. For example, if it is determined that there is flaw at 2 kHz based on the set of first user parameters SPLU1, the controller 1500 adjusts the set of first parameters of frequency response so as to increase the loudness at 1.8 kHz and 2.2 kHz and keep the loudness at 2 kHz unchanged.

Figure 9A:
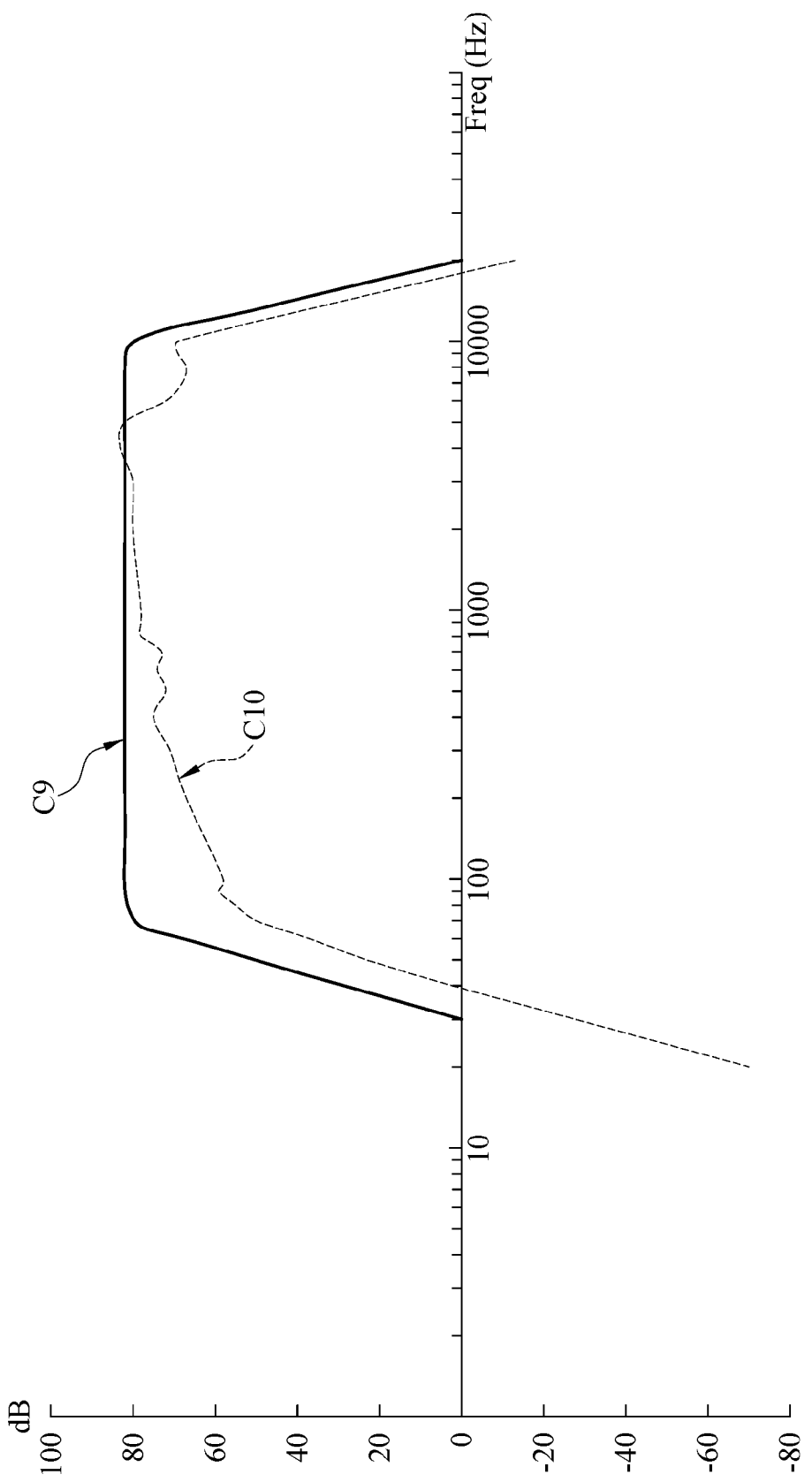
FIG. 9A illustrates the spectrum of the first user parameters and spectrum of the reference parameters of frequency response.
Figure 9B:
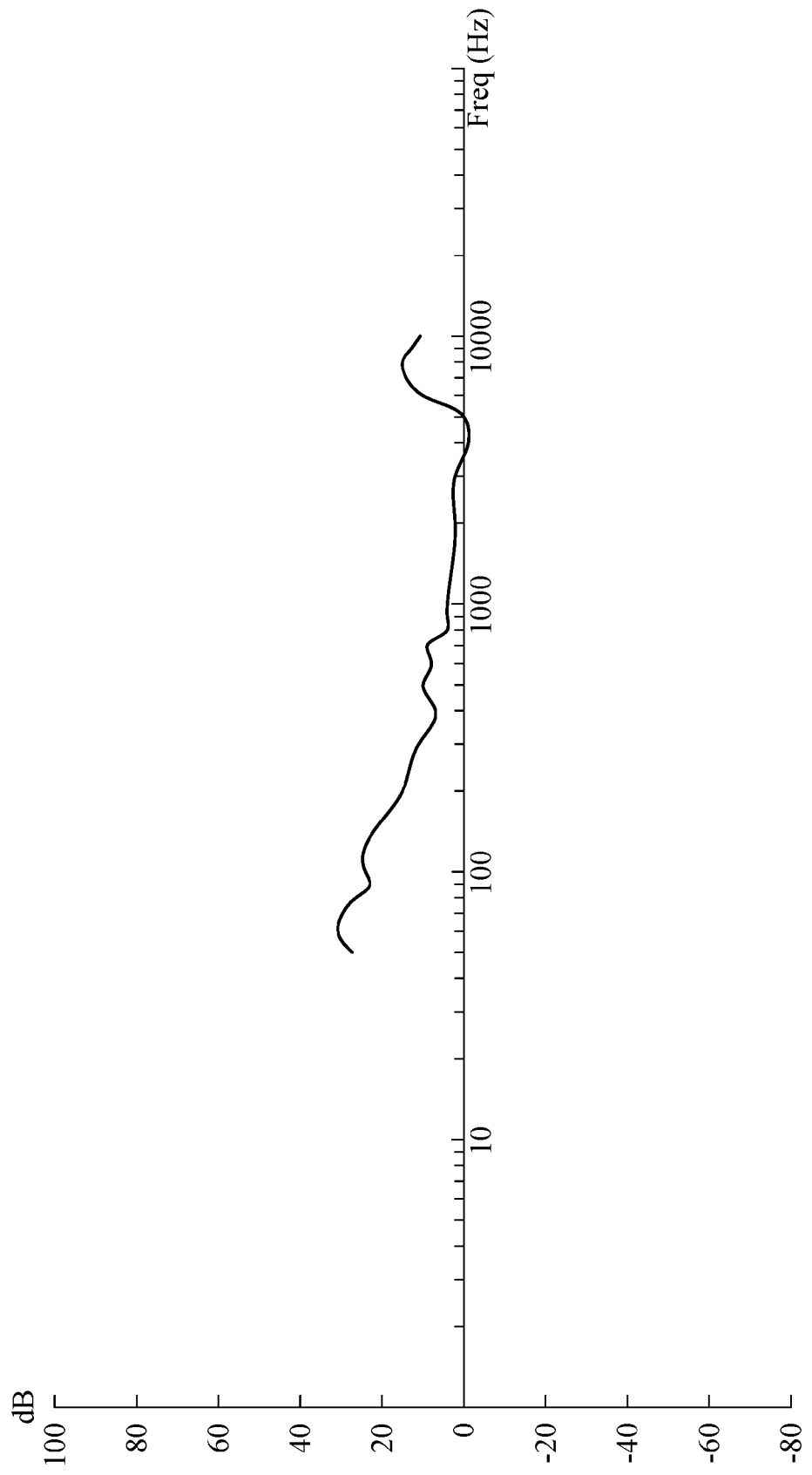
FIG. 9B illustrates a spectrum of the first parameters of frequency response obtained based on the two spectrums in FIG. 9A.

In one embodiment, please refer to FIG. 9A and FIG. 9B, wherein FIG. 9A illustrates the spectrum of the first user parameters and spectrum of the reference parameters of frequency response, and FIG. 9B illustrates a spectrum of the first parameters of frequency response obtained based on the two spectrums in FIG. 9A. In FIG. 9A, the curve C9 is, for example, a spectrum related to ideal hearing and the curve C10 is a spectrum related to the set of first user parameters SPLU1 obtained in the aforementioned test mode. The controller 1500 generates a spectrum as shown in FIG. 9B based on the curve C10 and the curve C9, also called as the reference parameters of frequency response, and adjusts the set of first parameters of frequency response based on the spectrum shown in FIG. 9B. Hence, when the first channel audio signal adjusted by the first equalizer 1300 is played by the first channel output device 1100, what is felt by the user 2000 is like the original first channel audio signal played by an ideal loudspeaker or an ideal earphone. The set of reference parameters of frequency response in this embodiment is, for example, the sound pressure level parameters of an expensive loudspeaker/earphone and is provided by the manufacturer (of the audio playing system 1000 or the expensive loudspeaker).

In another embodiment, however, the reference parameters of frequency response may be defined based on the equalizer parameters of frequency response set by the user 2000 when he uses the audio playing system. For example, the equalizer parameters of frequency response set by the user 2000 when he listens to rock music may be recorded by the controller 1500 as the first reference parameters of frequency response. The equalizer parameters of frequency response set by the user 2000 when he listens to classical music may be recorded by the controller 1500 as the second reference parameters of frequency response. In other words, the controller 1500 or a storage medium electrically connected to the controller 1500 may keep a plurality of sets of reference parameters of frequency response. These sets of reference parameters of frequency response may be related to the settings of a certain user in a variety of conditions such as circumstances, moods, or types of music. Otherwise, these sets of reference parameters of frequency response may be related to many users. Hence, when a user uses the audio playing system, he/she may quickly select a desired set of reference parameters of frequency response.

Figure 10:
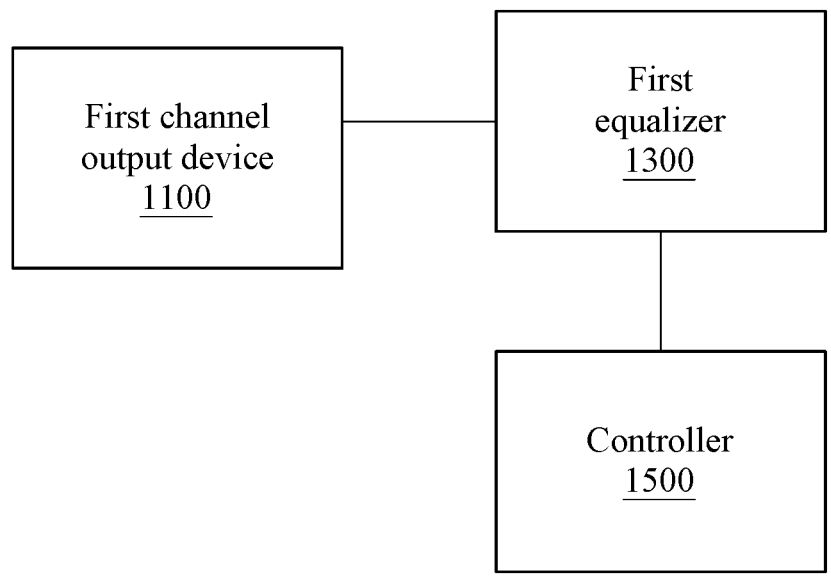
FIG. 10 is a schematic diagram of an audio playing system according to one embodiment of the present disclosure.

In the aforementioned embodiment, just as the architecture in FIG. 1, the controller 1500 is directly electrically connected to the first channel output device 1100 and the controller 1500 directly sends the test audio signal to the first channel output device 1100 for performing the test. In another embodiment, please refer to FIG. 10, the controller 1500 of the audio playing system 1000 A is not directly electrically connected to the first channel output device 1100 but electrically coupled to the first channel output device 1100 via the first equalizer 1300. In this embodiment, the controller 1500 first reset the set of first parameters of frequency response of the first equalizer 1300 and then sends the test audio signals to the first channel output device 1100 via the first equalizer 1300.

Figure 11A:
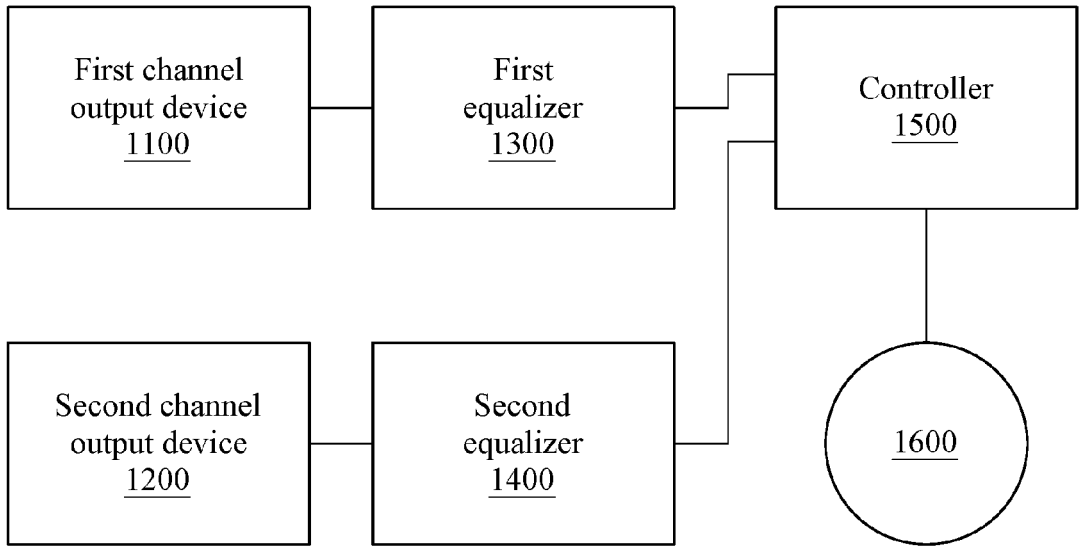
FIG. 11A illustrates a schematic block diagram of an audio playing system according to one embodiment of the present disclosure.

In one embodiment, please refer to FIG. 11A, which illustrates a schematic block diagram of an audio playing system according to one embodiment of the present disclosure. As shown in FIG. 11A, the audio playing system 1000B, compared with the audio playing system 1000 in FIG. 1, further has a second channel output device 1200 and a second equalizer 1400. In this embodiment, the relationship between the second equalizer 1400, the second channel output device 1200 and the controller 1500 is just the same as the relationship between the first equalizer 1300, the first channel output device 1100 and the controller 1500. In this embodiment, the controller 1500 respectively performs the test for the first channel output device 1100 and the second channel output device 1200 in the test mode so as to obtain a set of first user parameters and a set of second user parameters. The controller 1500 adjusts the set of first parameters of frequency response of the first equalizer 1300 based on the set of first user parameters and adjusts the set of second parameters of frequency response of the second equalizer 1400 based on the set of second user parameters. In other words, the set of adjusted first parameters of frequency response and the set of adjusted second parameters of frequency response may be different so as to compensate the difference between both channel output devices and both ears (of the user 2000). Hence, the audio playing system 1000B, being adjusted and compensated, provides better audio effect to the user 2000 in balance while compared with the conventional loudspeaker or earphone.

Figure 11B:
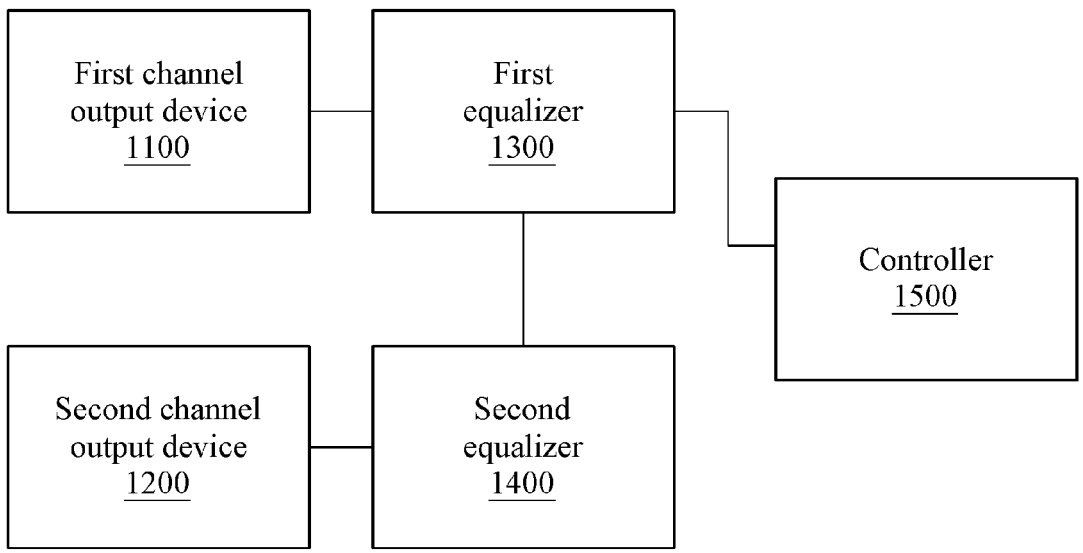
FIG. 11B illustrates a schematic diagram of an audio playing system according to one embodiment of the present disclosure.

In another embodiment, please refer to FIG. 11B, which illustrates a schematic diagram of an audio playing system according to one embodiment of the present disclosure. The audio playing system 1000C in FIG. 11B, compared with the audio playing system 1000B in FIG. 11A, has at least one difference that the controller 1500 is not directly electrically connected to the second equalizer 1400. Specifically, the controller 1500 is electrically coupled to the second equalizer 1400 via the first equalizer 1300, and the controller 1500 adjusts the set of second parameters of frequency response based on the set of second user parameters and the set of adjusted first parameters of frequency response. For example, if a 6 dB gain is needed at 1 kHz based on the set of second user parameters and the set of adjusted first parameters of frequency response provides a 2 dB gain at 1 kHz, the set of second parameters of frequency response is adjusted to provide a 4 dB gain at 1 kHz. Hence, the second channel audio signal is amplified with 6 dB gain at 1 kHz to meet the need of compensation after compensated by the first equalizer 1300 and the second equalizer 1400.

In another embodiment, the controller 1500 further determines an upper limit of loudness based on the set of first parameters of frequency response and the set of second parameters of frequency response. For example, the audio playing system 1000B or the audio playing system 1000C may have a loudness adjusting button 1600 controlled by the user 2000 to generate a loudness instruction. However, because the set of first parameters of frequency response and/or the set of second parameters of frequency response is adjusted, the loudness instruction generated by the loudness adjusting button 1600 may result in the fact that the loudness of sound output by the first channel output device 1100 and/or the second channel output device 1200 is too large and harms the hearing of the user 2000. The controller 1500 is capable of adjusting the loudness related to the first channel audio signal and/or the loudness related to the second channel audio signal based on the upper limit of loudness and the loudness instruction.

For example, when the controller 1500 determines that the loudness instruction would make the loudness related to the first channel audio signal too large and harm the user's hearing, the controller 1500 does not control the loudness related to the first channel audio signal with the loudness instruction but with the upper limit of loudness. Otherwise, the controller 1500 controls the loudness related to the first channel audio signal with the loudness instruction. In another embodiment, when the controller 1500 determines the loudness related to the first channel audio signal, the controller 1500 also adjusts the loudness related to the second channel audio signal based on the loudness related to the first channel audio signal to prevent the user 2000 from feeling the unbalance between two channels.

Figure 12:
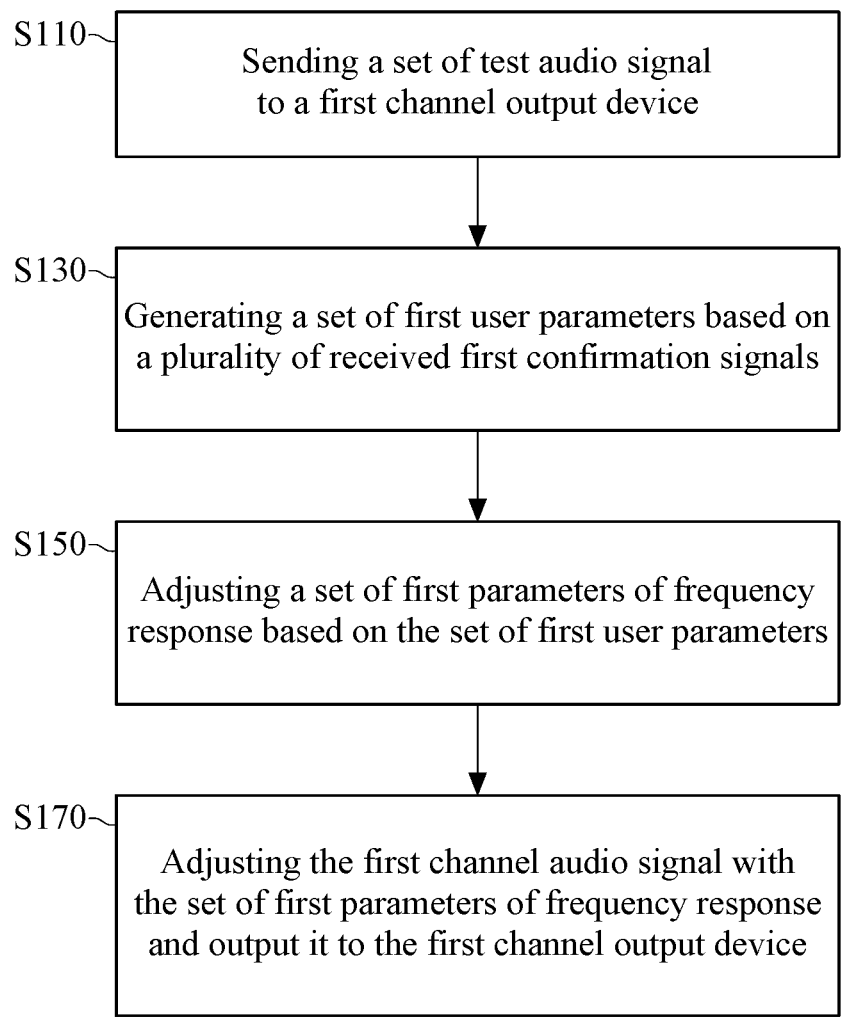
FIG. 12 is a method for controlling the audio playing system according to one embodiment of the present disclosure.

As above, the method for controlling the audio playing system may be concluded as below. Please refer to FIG. 12, which is a method for controlling the audio playing system according to one embodiment of the present disclosure. As shown in step S110, the controller sends a set of test audio signals to the first channel output device. As shown in step S130, the controller generates a set of first user parameters based on a plurality of piece of first confirmation signal received. As shown in step S150, the controller adjusts a set of first parameters of frequency response based on the set of first user parameters. As shown in step S170, the first equalizer adjusts the received first channel audio signal with the set of first parameters of frequency response and outputs the adjusted first channel audio signal to the first channel output device. The method may be implemented with either the aforementioned hardware or software application program.

As above, the audio playing system according to one embodiment of the present disclosure adjusts the parameters of frequency response of the equalizer based on the measurement of the response of the user for the test audio signal played by the channel output device so as to compensate the sensitivity of user's hearing and/or the sound pressure level response of the channel output device.

What is claimed is:

1. An audio playing system, comprising:
a first channel output device;
a first equalizer electrically coupled to the first channel output device, having a set of first parameters of frequency response, configured to adjust a first channel audio signal with the set of first parameters of frequency response and to output the adjusted first channel audio signal to the first channel output device;
a second channel output device;
a second equalizer electrically coupled to the second channel output device, having a set of second parameters of frequency response, configured to adjust a second channel audio signal with the set of second parameters of frequency response and to output the adjusted second channel audio signal to the second channel output device;
a loudness adjusting button configured to generate a loudness instruction; and
a controller electrically coupled to the loudness adjusting button, the first channel output device, the second channel output device, the first equalizer and the second equalizer, wherein in a test mode, the controller is configured to send a set of test audio signals to the first channel output device, to generate a set of first user parameters based on a plurality of pieces of received first confirmation signal, to adjust the set of first parameters of frequency response based on the set of first user parameters, to send the set of test audio signals to the second channel output device, to generate a set of second user parameters based on a plurality of pieces of received second confirmation signal, and to adjust the set of second parameters of frequency response based on the set of second user parameters;
wherein the controller determines an upper limit of loudness based on the set of first parameters of frequency response and the set of second parameters of frequency response, and adjusts a loudness related to the first channel audio signal and a loudness related to the second channel audio signal based on the upper limit of loudness and the loudness instruction.

2. The system in claim 1, wherein the set of test audio signals comprising a plurality of sets of narrow bandwidth audio signals, and the sets of narrow bandwidth audio signals are different from each other in band, and each set of narrow bandwidth audio signals has a plurality of pieces of narrow bandwidth test audio signals, and the pieces of narrow bandwidth test audio signals are different from each other in loudness.

3. The system in claim 2, wherein a difference between central frequencies of the sets of narrow bandwidth audio signals are at least 500 Hz.

4. The system in claim 2, wherein the controller classifies the sets of narrow bandwidth audio signals into a first category including a plurality of sets of narrow bandwidth audio signals in low-band, a second category including a plurality of sets of narrow bandwidth audio signals in mid-band, and a third category including a plurality of sets of narrow bandwidth audio signals in high-band, and in the test mode, the controller is configured to send at least one set of narrow bandwidth audio signals in the first category, in the second category, and in the third category in sequence.

5. The system in claim 1, wherein the controller is electrically coupled to the first channel output device via the first equalizer, and in the test mode, the controller resets the set of first parameters of frequency response and sends the set of test audio signals to the first equalizer.

6. The system in claim 1, wherein the controller is electrically coupled to the first channel output device without via the first equalizer, and in the test mode, the controller directly sends the set of test audio signals to the first channel output device.

7. The system in claim 1, wherein the controller is electrically coupled to the second equalizer via the first equalizer, and the controller adjusts the set of second parameters of frequency response based on the set of second user parameters and the set of first parameters of frequency response.

8. The system in claim 1, wherein the controller adjusts the set of first parameters of frequency response further based on a set of reference parameters of frequency response.

* * * * *